United States Patent
Stroet

(10) Patent No.: US 12,271,216 B2
(45) Date of Patent: Apr. 8, 2025

(54) LOGARITHMIC CURRENT TO VOLTAGE CONVERTERS

(71) Applicant: Analog Devices, Inc., Wilmington, MA (US)

(72) Inventor: Petrus M. Stroet, Santa Cruz, CA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 18/040,025

(22) PCT Filed: Nov. 30, 2021

(86) PCT No.: PCT/US2021/072629
§ 371 (c)(1),
(2) Date: Jan. 31, 2023

(87) PCT Pub. No.: WO2022/120329
PCT Pub. Date: Jun. 9, 2022

(65) Prior Publication Data
US 2023/0409066 A1    Dec. 21, 2023

Related U.S. Application Data

(60) Provisional application No. 63/199,045, filed on Dec. 3, 2020.

(51) Int. Cl.
*G05F 1/59* (2006.01)
*G05F 1/46* (2006.01)
*H01L 31/02* (2006.01)

(52) U.S. Cl.
CPC .............. *G05F 1/59* (2013.01); *G05F 1/468* (2013.01); *H01L 31/02019* (2013.01)

(58) Field of Classification Search
CPC .................................. G05F 1/59; G05F 1/468
See application file for complete search history.

(56) References Cited

U.S. PATENT DOCUMENTS 3,845,326 A    10/1974  Godden
3,992,622 A    11/1976  Numata et al.
(Continued)

FOREIGN PATENT DOCUMENTS

CN    101510802 A    8/2009
CN    107305404 A    10/2017
(Continued)

OTHER PUBLICATIONS

B. Gilbert; "Limiting-Logarithmic Amplifiers"; Electronics Laboratories Advanced Engineering Course on RF IC Design for Wireless Communication Systems; Lausanne, Switzerland, Jul. 1995, in 126 pages.

(Continued)

*Primary Examiner* — Alex Torres-Rivera
*Assistant Examiner* — Lakaisha Jackson
(74) *Attorney, Agent, or Firm* — Knobbe, Martens, Olson & Bear, LLP

(57) ABSTRACT

Apparatus and methods for logarithmic current to voltage conversion are disclosed herein. In certain embodiments, a logarithmic current to voltage converter includes an input terminal that receives an input current, an output terminal that provides a logarithmic output voltage, a first field-effect transistor (FET) having a gate connected to the input terminal, a first bipolar transistor having a collector connected to the input terminal and an emitter connected to the output terminal, and a stacked transistor connected to the output terminal and to the first FET to form a feedback loop. For example, the stacked transistor can correspond to a second bipolar transistor having a collector connected to the output terminal and a base connected to the source of the first FET, or to a second FET having a drain connected to the output terminal and a gate connected to the source of the first FET.

20 Claims, 12 Drawing Sheets

(56) References Cited

U.S. PATENT DOCUMENTS

| | | | |
|---|---|---|---|
| 4,870,327 | A | 9/1989 | Jorgensen |
| 5,200,655 | A | 4/1993 | Feldt |
| 5,444,361 | A | 8/1995 | Ryat |
| 5,465,070 | A * | 11/1995 | Koyama .............. G06G 7/24 327/350 |
| 5,489,868 | A | 2/1996 | Gilbert |
| 5,578,958 | A | 11/1996 | Yasuda |
| 6,417,702 | B1 | 7/2002 | Wang |
| 7,310,656 | B1 | 12/2007 | Gilbert |
| 7,375,576 | B2 | 5/2008 | Groiss |
| 7,395,308 | B1 | 7/2008 | Gilbert |
| 7,969,223 | B1 | 6/2011 | Gilbert |
| 8,004,341 | B1 | 8/2011 | Gilbert |
| 8,184,029 | B1 | 5/2012 | Hsieh et al. |
| 8,207,776 | B1 | 6/2012 | Gilbert |
| 9,099,137 | B2 | 8/2015 | Natzke et al. |
| 9,397,625 | B1 | 7/2016 | Gilbert |
| 9,515,605 | B1 * | 12/2016 | Madala .............. H03B 5/32 |
| 10,243,544 | B1 | 3/2019 | Gutnik |
| 10,651,835 | B1 | 5/2020 | Gutnik |
| 10,794,761 | B2 | 10/2020 | Young et al. |
| 2012/0091322 | A1 | 4/2012 | Kuroda |
| 2013/0110896 | A1 | 5/2013 | Nakai |
| 2014/0266140 | A1* | 9/2014 | Iriarte .............. G05F 3/242 323/313 |
| 2015/0022267 | A1 | 1/2015 | Wurcer |
| 2017/0017285 | A1 | 1/2017 | Kurokawa et al. |
| 2020/0068149 | A1 | 2/2020 | Finateu et al. |
| 2024/0250647 | A1 | 7/2024 | Stroet |

FOREIGN PATENT DOCUMENTS

| | | |
|---|---|---|
| EP | 0830731 B1 | 3/1998 |
| JP | 2827397 B2 | 11/1998 |
| JP | 3333239 B2 | 10/2002 |
| JP | 2003133867 A | 5/2003 |
| JP | 2004342950 A | 12/2004 |
| KR | 100824376 B1 | 4/2008 |
| KR | 2011-0091848 A | 8/2011 |
| WO | WO2020199641 A1 | 10/2020 |

OTHER PUBLICATIONS

International Search Report and Written Opinion for International Application No. PCT/US2021/072629 dated Mar. 21, 2022 in 9 pages.

Extended European Search Report for International Application No. 21901636.7 dated Dec. 9, 2024 in 11 pages.

Office Action with Translation Issued for Chinese Application No. 202180054752.4 dated Jan. 14, 2025 in 9 pages.

* cited by examiner

LOGARITHMIC CURRENT TO VOLTAGE CONVERTERS

FIELD OF THE DISCLOSURE

Embodiments of the invention relate to electronic systems, and more particularly to, electronic circuits for logarithmic conversion or detection.

BACKGROUND

Logarithmic converters or detectors provide an output signal that changes in relation to a logarithm of an applied input signal.

One type of logarithmic detector is a trans-linear logarithmic detector that uses the trans-linear properties of a bipolar transistor to provide logarithmic conversion. In one example, a collector and a base of an NPN bipolar transistor are directly connected to a gate and a source, respectively, of an n-type metal-oxide-semiconductor (NMOS) transistor. Additionally, an input current is applied to the collector of NPN bipolar transistor and the base of the NPN bipolar transistor generates a log voltage. Although such a circuit can provide logarithmic detection, the collector-to-base voltage of the NPN bipolar transistor is not very close to zero, leading to undesirable performance characteristics such as poor log-linear dynamic range for small input currents.

In another example of a trans-linear logarithmic detector, a collector and an emitter of an NPN bipolar transistor are directly connected to an inverting input and an output, respectively, of an operational amplifier (op-amp). Additionally, a base of the NPN bipolar transistor and a non-inverting input of the op-amp are grounded, while an input current is applied to the collector of NPN bipolar transistor such that the emitter of the NPN bipolar transistor generates a log voltage. By using the op-amp, the collector-to-base voltage of the NPN bipolar transistor can be controlled close to zero.

In certain applications, a second copy of a logarithmic detector is included and driven by a reference current, with a difference between the pair of logarithmic detectors taken to cancel the saturation current of the NPN bipolar transistor.

SUMMARY OF THE DISCLOSURE

Apparatus and methods for logarithmic current to voltage conversion are disclosed herein. In certain embodiments, a logarithmic current to voltage converter includes an input terminal that receives an input current, an output terminal that provides a logarithmic output voltage, a first field-effect transistor (FET) having a gate connected to the input terminal, a first bipolar transistor having a collector connected to the input terminal and an emitter connected to the output terminal, and a stacked transistor connected to the output terminal and to the first FET to form a feedback loop. For example, the stacked transistor can correspond to a second bipolar transistor having a collector connected to the output terminal and a base connected to the source of the first FET, or to a second FET having a drain connected to the output terminal and a gate connected to the source of the first FET.

In one aspect, a logarithmic current to voltage converter includes an input terminal configured to receive an input current, an output terminal configured to provide a logarithmic output voltage, a first field-effect transistor (FET) having a gate connected to the input terminal, a first bipolar transistor having a collector connected to the input terminal and an emitter connected to the output terminal, and a stacked transistor connected to the output terminal and to the first FET.

In another aspect, a photocurrent detection system includes a photodetector configured to generate an input current, and a semiconductor die including a first logarithmic converter. The first logarithmic converter includes an input terminal configured to receive the input current, an output terminal configured to provide a first logarithmic output voltage, a first field-effect transistor (FET) having a gate connected to the input terminal, a first bipolar transistor having a collector connected to the input terminal and an emitter connected to the output terminal, and a stacked transistor connected to the output terminal and to the first FET.

In another aspect, a method of logarithmic current to voltage conversion is provided. The method includes providing an input current from an input terminal to a collector of a first bipolar transistor, providing a logarithmic output voltage from an emitter of the first bipolar transistor to an output terminal, and providing feedback from the output terminal to the input terminal through a stacked transistor and a first field-effect transistor (FET), a gate of the first field-effect transistor (FET) connected to the input terminal and the stacked transistor connected to the output terminal and a source of the first FET.

DETAILED DESCRIPTION

Figure 1A:
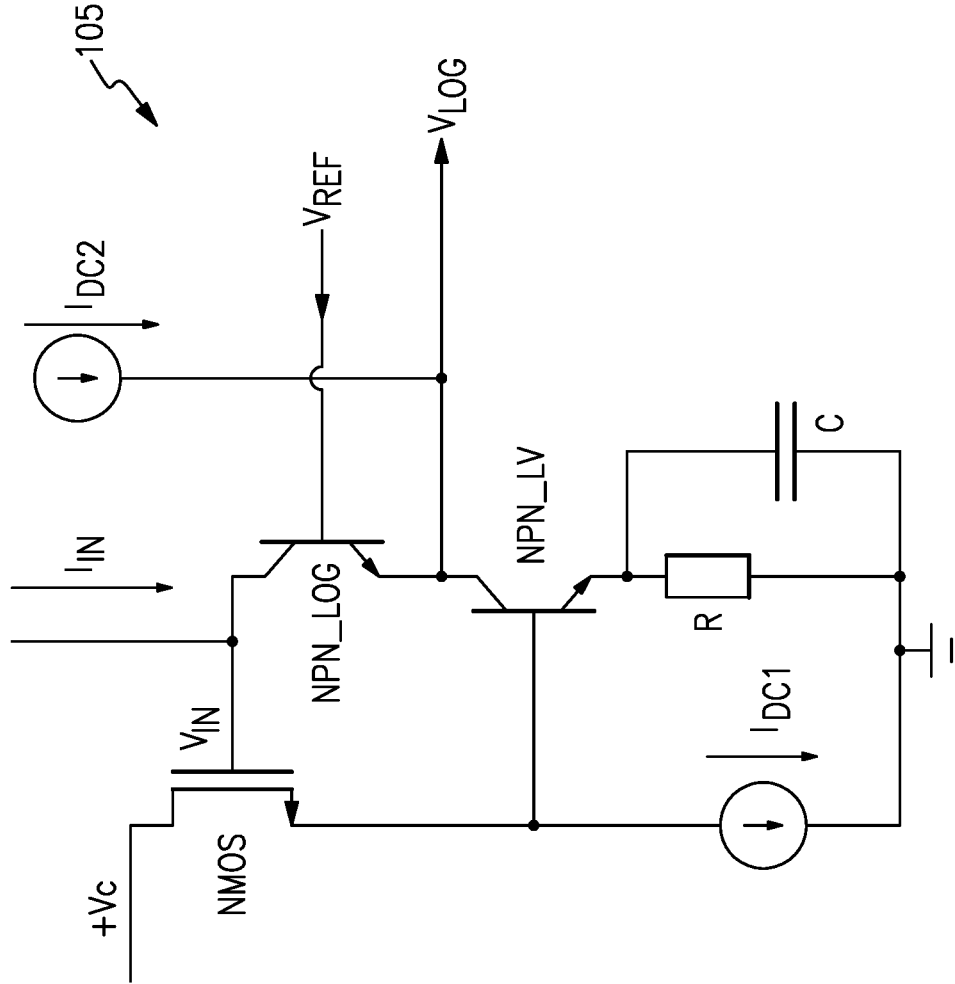
FIG. 1A is a schematic diagram of one embodiment of a logarithmic converter.

The following detailed description of embodiments presents various descriptions of specific embodiments of the invention. However, the invention can be embodied in a multitude of different ways. In this description, reference is made to drawings. It will be understood that elements illustrated in the figures are not necessarily drawn to scale. Moreover, it will be understood that certain embodiments can include more elements than illustrated in a drawing and/or a subset of the elements illustrated in a drawing.

Further, some embodiments can incorporate any suitable combination of features from two or more drawings.

Apparatus and methods for logarithmic current to voltage conversion are disclosed herein. In certain embodiments, a logarithmic current to voltage converter includes an input terminal that receives an input current, an output terminal that provides a logarithmic output voltage, a first field-effect transistor (FET) having a gate connected to the input terminal, a first bipolar transistor having a collector connected to the input terminal and an emitter connected to the output terminal, and a stacked transistor connected to the output terminal and to the first FET to form a feedback loop. For example, the stacked transistor can correspond to a second bipolar transistor having a collector connected to the output terminal and a base connected to the source of the first FET, or to a second FET having a drain connected to the output terminal and a gate connected to the source of the first FET.

By implementing the logarithmic current to voltage converter in this manner, a single-ended logarithmic current to voltage converter is provided using only three active devices in the feedback loop. Such a configuration offers superior speed, stability, precision, noise, and/or robustness against electrostatic discharge (ESD) events over a large input current dynamic range.

For example, rather than using an op-amp with a differential input stage, better phase margin can be achieved with a single-ended configuration using a feedback loop with only three active devices. Moreover, the single-ended configuration largely reduces undershoot because of the much higher frequency of the second pole, which results in a faster logarithmic detector.

In certain implementations, the logarithmic current to voltage converter is partitioned or divided into smaller copies to improve high frequency stability (for example, at radio frequency or RF) due to shorter connections and improved ESD performance because of dissipation spread.

Although the logarithmic current to voltage converter can include only three active devices in some embodiments, in other embodiments additional active devices can be included.

For example, in another embodiment, one or more follower devices (for example, emitter follower stages and/or source follower stages) can be added between the stacked transistor and the first FET. When such follower(s) are suitably biased, only a relatively small phase shift is introduced. The follower(s) can provide buffering but lead to an increase in the input voltage (for instance, by a base-to-emitter voltage $V_{BE}$ for an emitter follower) and corresponding decrease in voltage headroom (for example, for an active biasing circuit of a photodiode in a photodetector application).

In certain implementations, a filter, such as a parallel resistor and capacitor filter, is included between the stacked transistor and a fixed voltage, such as ground. The components of the filter, such as the resistor and/or capacitor, can be controllable (for instance, programmable over an interface of a semiconductor die) to allow tuning of the filtering characteristic.

The logarithmic current to voltage converters herein can use transistors of a wide variety of polarities and types. For example, the teachings herein are applicable to configurations using p-type devices and/or n-type devices, as well as to a wide range of types of FETs and/or bipolar transistors.

In certain implementations, the stacked transistor is a low voltage device, thereby providing increased bandwidth relative to a configuration in which the stacked transistor is a regularly-rated voltage device or a high voltage device. Thus, in some implementations, a voltage rating of the stacked transistor is less than that of the first bipolar transistor and/or first FET.

Figure 1B:
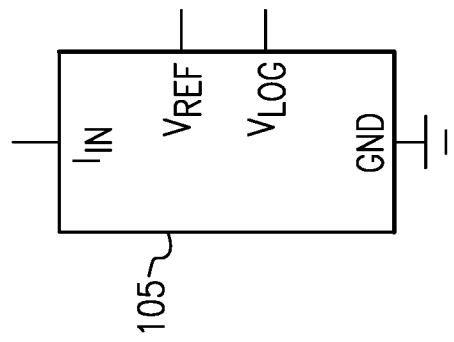
FIG. 1B is a schematic diagram of a block-level circuit symbol for the logarithmic converter of FIG. 1A.

FIG. 1A is a schematic diagram of one embodiment of a logarithmic converter 105. FIG. 1B is a schematic diagram of a block-level circuit symbol for the logarithmic converter 105 of FIG. 1A.

In the illustrated embodiment, the logarithmic converter 105 includes a FET transistor (NMOS, in this example), a first bipolar transistor NPN_LOG (n-type, in this example), a second bipolar transistor NPN_LV (n-type, in this example), a first DC current source $I_{DC1}$, a second DC current source $I_{DC2}$, a filter resistor R, and a filter capacitor C.

The NMOS transistor includes a drain that receives a power supply voltage +Vc, and a gate connected to a collector of the first bipolar transistor NPN_LOG and to an input terminal (which receives an input current $I_{IN}$ and has an input voltage VIN). The NMOS transistor further includes a source connected to a base of the second bipolar transistor NPN_LV and to the first DC current source $I_{DC1}$. Additionally, a base of the first bipolar transistor NPN_LOG receives a reference voltage $V_{REF}$, and an emitter of the first bipolar transistor NPN_LOG is connected to an output terminal (which provides a logarithmic voltage $V_{LOG}$), to the second DC current source $I_{DC2}$, and to a collector of the second bipolar transistor NPN_LV. The filter resistor R and the filter capacitor C are electrically connected in parallel with one another between an emitter of the second bipolar transistor NPN_LV and ground.

As shown in FIG. 1A, the input current $I_{IN}$ received from the input terminal is provided to the collector of the first bipolar transistor NPN_LOG. Additionally, the logarithmic converter 105 converts the input current $I_{IN}$ into the logarithmic voltage $V_{LOG}$, which is provided at the output terminal.

In the illustrated embodiment, the filter resistor R and the filter capacitor C operate to extend the bandwidth of the collector current over base voltage while reducing the loop gain at high levels of the input current $I_{IN}$. By extending the bandwidth, little to no excess phase shift is introduced and compensation capacitors of lower capacitance can be used. In certain implementations, the resistor R and/or the capacitor C is controllable (for example, by using a resistor array and/or capacitor array that is programmable to control corner frequency).

The logarithmic converter 105 can achieve a higher speed relative to a configuration using an op amp to provide feedback. For example, when an op amp is included in the feedback loop, the additional components introduce extra phase shift that in effect shifts the second-order pole downwards in frequency. In order to keep the loop stable, higher value compensation capacitors can be added. However, high capacitance will slow the circuit down.

Moreover, the logarithmic converter 105 has superior noise performance at low levels of the input current $I_{IN}$ relative to an implementation with an op-amp in the feedback loop. For example, when an op-amp provides feedback at low input current levels, the bandwidth of the circuit reduces considerably, resulting in the loop gain to drop below 0 dB at a frequency below the baseband bandwidth of the rest of the circuit. This results in the loop not cancelling the bias noise sources in a significant manner. In that case, any noise voltage present on the reference voltage will be amplified significantly by the op-amp.

In contrast, any noise on the reference voltage $V_{REF}$ in FIG. 1A will be amplified much less since the amplification at the base of the first bipolar transistor NPN_LOG (which is connected as a common-base stage) is much lower.

Figure 2:
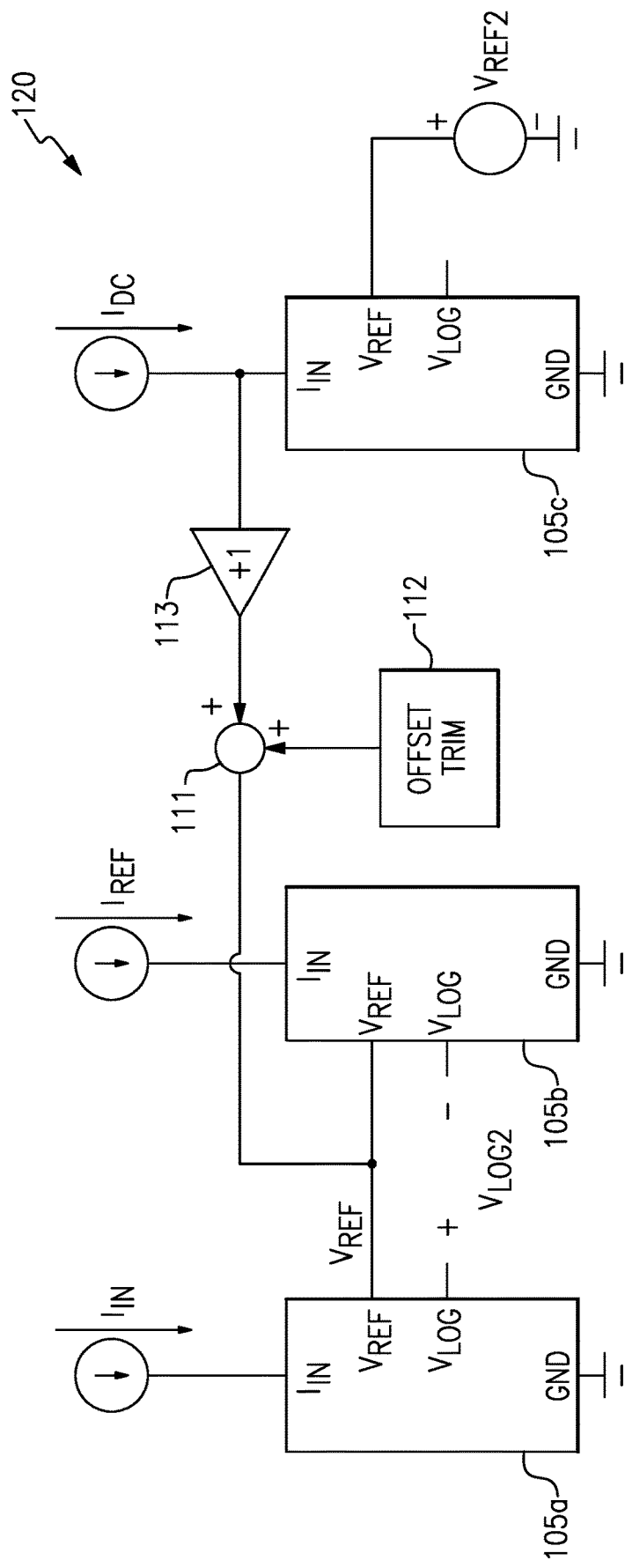
FIG. 2 is a schematic diagram of one embodiment of a logarithmic conversion system.

FIG. 2 is a schematic diagram of one embodiment of a logarithmic conversion system 120. The logarithmic conversion system 120 includes a first logarithmic converter 105a, a second logarithmic converter 105b, a third logarithmic converter 105c, a reference current source $I_{REF}$, a DC current source $I_{DC}$, a reference voltage source $V_{REF2}$, an adder 111, an offset trim circuit 112, and a buffer 113. The logarithmic conversion system 120 is also depicted with an input current source $I_{IN}$, which represents a photodiode or other input current source to the system.

As shown in FIG. 2, multiple instantiations or replicas of the logarithmic converter 105 of FIGS. 1A and 1B have been arranged to provide logarithmic current to voltage conversion with enhanced performance. In particular, the first logarithmic converter 105a serves as an input channel, the second logarithmic converter 105b serves as a reference channel, and the third logarithmic converter 105c serves as a DC channel.

In the illustrated embodiment, the DC current from the DC current source $I_{DC}$ is provided as an input to the third logarithmic converter 105c, which is biased by the reference voltage source $V_{REF2}$. Additionally, the buffer 113 buffers the input voltage to the third logarithmic converter 105c. The buffered voltage from the buffer 113 is trimmed by the offset trim circuit 112 to generate a reference voltage $V_{REF}$ for the first logarithmic converter 105a and the second logarithmic converter 105b.

By implementing the logarithmic conversion system 120 in this manner, high dynamic range is achieved by setting the voltage reference $V_{REF}$ in such a manner that the collector-to-emitter voltages (of bipolar transistors NPN_LOG within the converters 105a and are close to zero. In particular, the logarithmic conversion system 120 applies a DC current to the third logarithmic converter 105c, which is biased with the reference voltage source $V_{REF2}$. The precision of the reference voltage source $V_{REF2}$ can be relaxed compared to a precision of the reference voltage $V_{REF}$ since the DC current from the DC current source $I_{DC}$ can be scaled to be much higher than a minimum value of the input current $I_{IN}$.

With continuing reference to FIG. 2, the input channel (the first logarithmic converter 105a), the reference channel (the second logarithmic converter 105b), and the DC channel (the third logarithmic converter 105c) can be scaled in size to provide enhanced performance. In one implementation, the input channel and the reference channel have a scaling factor 8 while the DC channel has a scaling factor 2. Although one example of scaling factors is provided, other scaling factors can be used.

Since the DC current from the DC current source $I_{DC}$ can be chosen to be in the middle of the dynamic range of the input current source $I_{IN}$ (for instance, 10 µA), larger deviations around zero of the collector-base voltage of bipolar transistor NPN_LOG has little to no impact on accuracy.

As shown in FIG. 2, the log voltage $V_{LOG2}$ is taken differentially between the $V_{LOG}$ outputs of the first logarithmic converter 105a and the second logarithmic converter 105b. By using a differential voltage between the input channel and the reference channel, the saturation current of the bipolar transistors (NPN_LOG transistors within converters 105a and 105b) is canceled.

In the illustrated embodiment, the buffer 113 is a +1 voltage buffer. The buffer 113 is applied to the input voltage of the DC channel to bias the input and reference channels ($V_{REF}$ voltages). The offset trim circuit 112 can be used to correct for mismatches and/or for the difference between the DC current in the DC channel and the lowest input current in the input channel.

Moreover, in certain embodiments, the offset trim circuit 112 applies a correction voltage, such as a proportional to temperature (PTAT) voltage (for instance, around which is added to the reference voltage $V_{REF}$ to correct for low input current $I_{IN}$ and/or high temperature deviations.

Figure 3A:
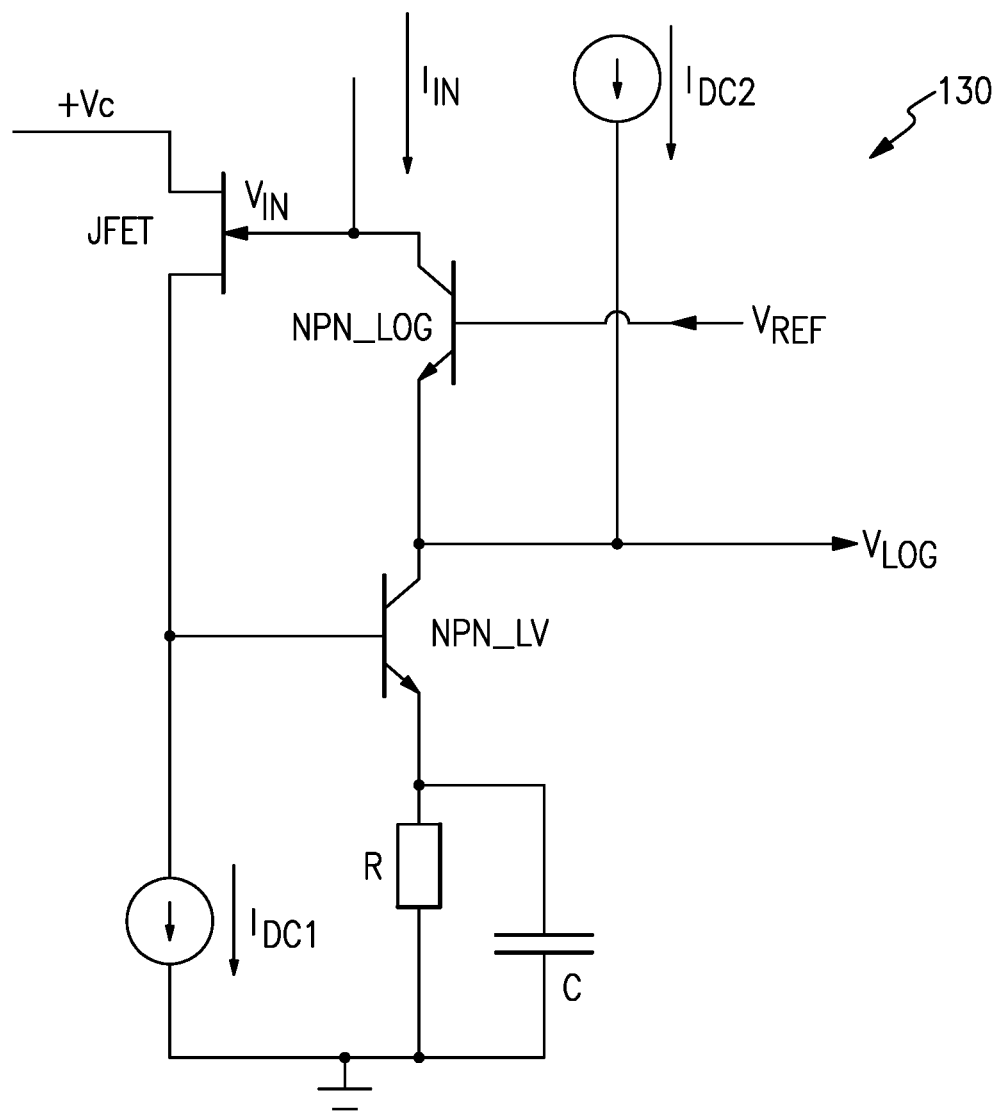
FIG. 3A is a schematic diagram of another embodiment of a logarithmic converter.

FIG. 3A is a schematic diagram of another embodiment of a logarithmic converter 130. The logarithmic converter 130 includes a FET transistor (junction field-effect transistor or JFET, in this example), a first bipolar transistor NPN_LOG (n-type, in this example), a second bipolar transistor NPN_LV (n-type, in this example), a first DC current source $I_{DC1}$, a second DC current source $I_{DC2}$, a filter resistor R, and a filter capacitor C.

The logarithmic converter 130 of FIG. 3A is similar to the logarithmic converter 105 of FIGS. 1A and 1B, except that the logarithmic converter 130 includes the JFET rather than the NMOS transistor.

Figure 3B:
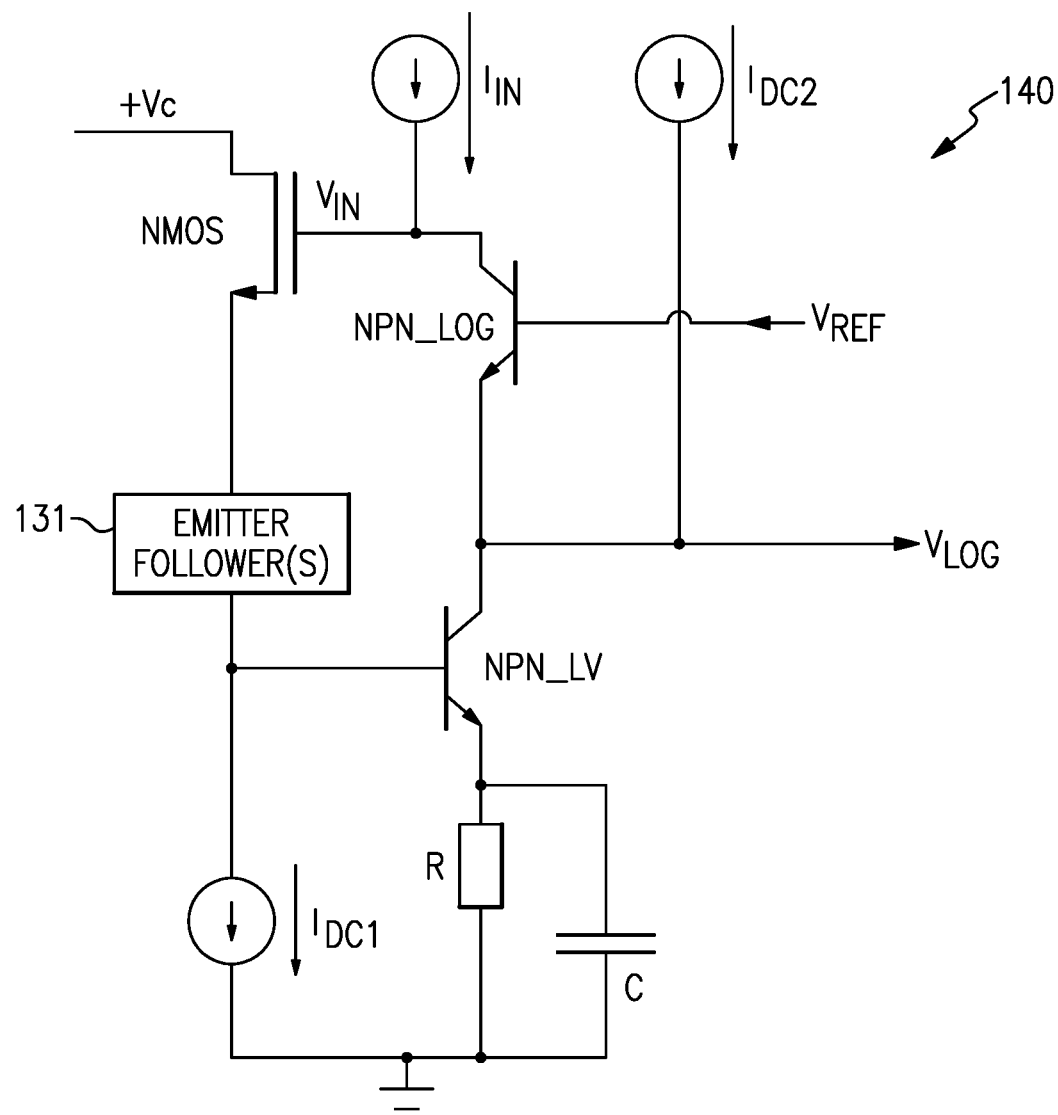
FIG. 3B is a schematic diagram of another embodiment of a logarithmic converter.

FIG. 3B is a schematic diagram of another embodiment of a logarithmic converter 140. The logarithmic converter 140 includes a FET transistor (NMOS, in this example), a first bipolar transistor NPN_LOG (n-type, in this example), a second bipolar transistor NPN_LV (n-type, in this example), a first DC current source $I_{DC1}$, a second DC current source $I_{DC2}$, a filter resistor R, a filter capacitor C, and one or more emitter followers 131.

The logarithmic converter 140 of FIG. 3B is similar to the logarithmic converter 105 of FIGS. 1A and 1B, except that the logarithmic converter 140 further includes the emitter follower(s) 131 connected between the source of the NMOS transistor and the base of the second bipolar transistor NPN_LV.

Figure 3C:
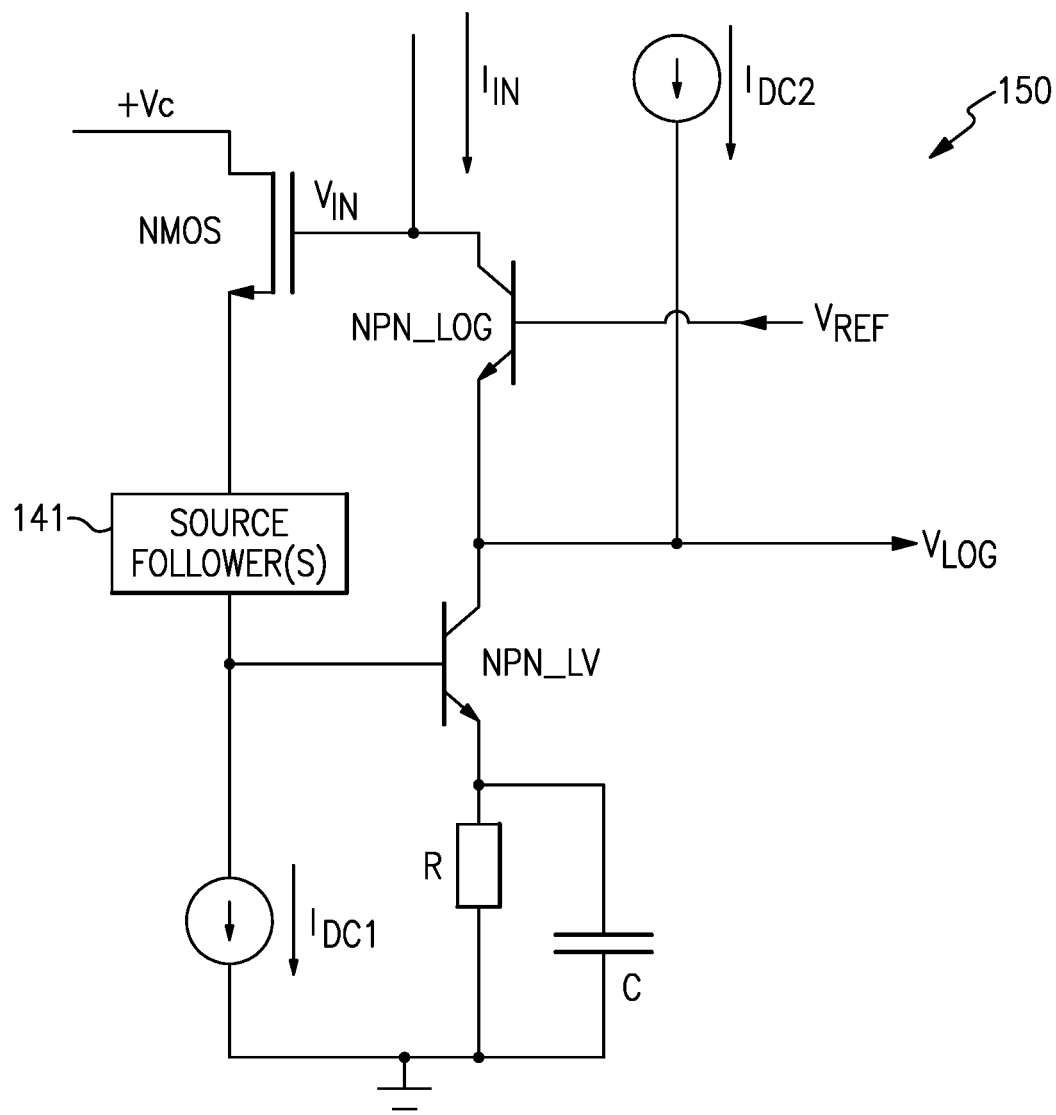
FIG. 3C is a schematic diagram of another embodiment of a logarithmic converter.

FIG. 3C is a schematic diagram of another embodiment of a logarithmic converter 150. The logarithmic converter 150 includes a FET transistor (NMOS, in this example), a first bipolar transistor NPN_LOG (n-type, in this example), a second bipolar transistor NPN_LV (n-type, in this example), a first DC current source $I_{DC1}$, a second DC current source $I_{DC2}$, a filter resistor R, a filter capacitor C, and one or more source followers 141.

The logarithmic converter 150 of FIG. 3C is similar to the logarithmic converter 105 of FIGS. 1A and 1B, except that the logarithmic converter 150 further includes the source follower(s) 141 connected between the source of the NMOS transistor and the base of the second bipolar transistor NPN_LV.

Figure 3D:
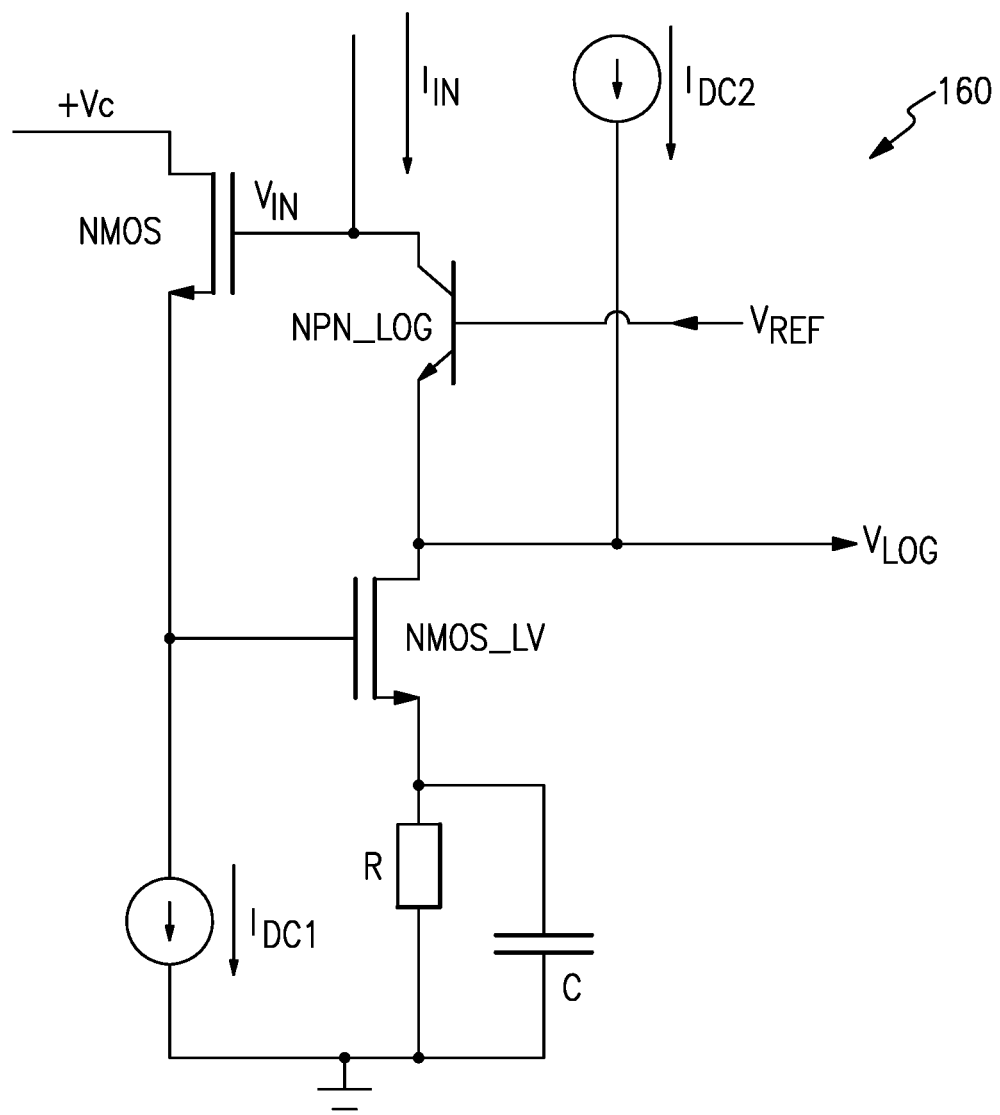
FIG. 3D is a schematic diagram of another embodiment of a logarithmic converter.

FIG. 3D is a schematic diagram of another embodiment of a logarithmic converter 160. The logarithmic converter 160 includes a first FET (NMOS), a bipolar transistor NPN_LOG (n-type, in this example), a second FET (NMOS_LV), a first DC current source $I_{DC1}$, a second DC current source $I_{DC2}$, a filter resistor R, and a filter capacitor C.

The logarithmic converter 160 of FIG. 3D is similar to the logarithmic converter 105 of FIGS. 1A and 1B, except that the logarithmic converter 160 includes the second FET (NMOS_LV) rather than the second bipolar transistor (NPN_LV).

Figure 3E:
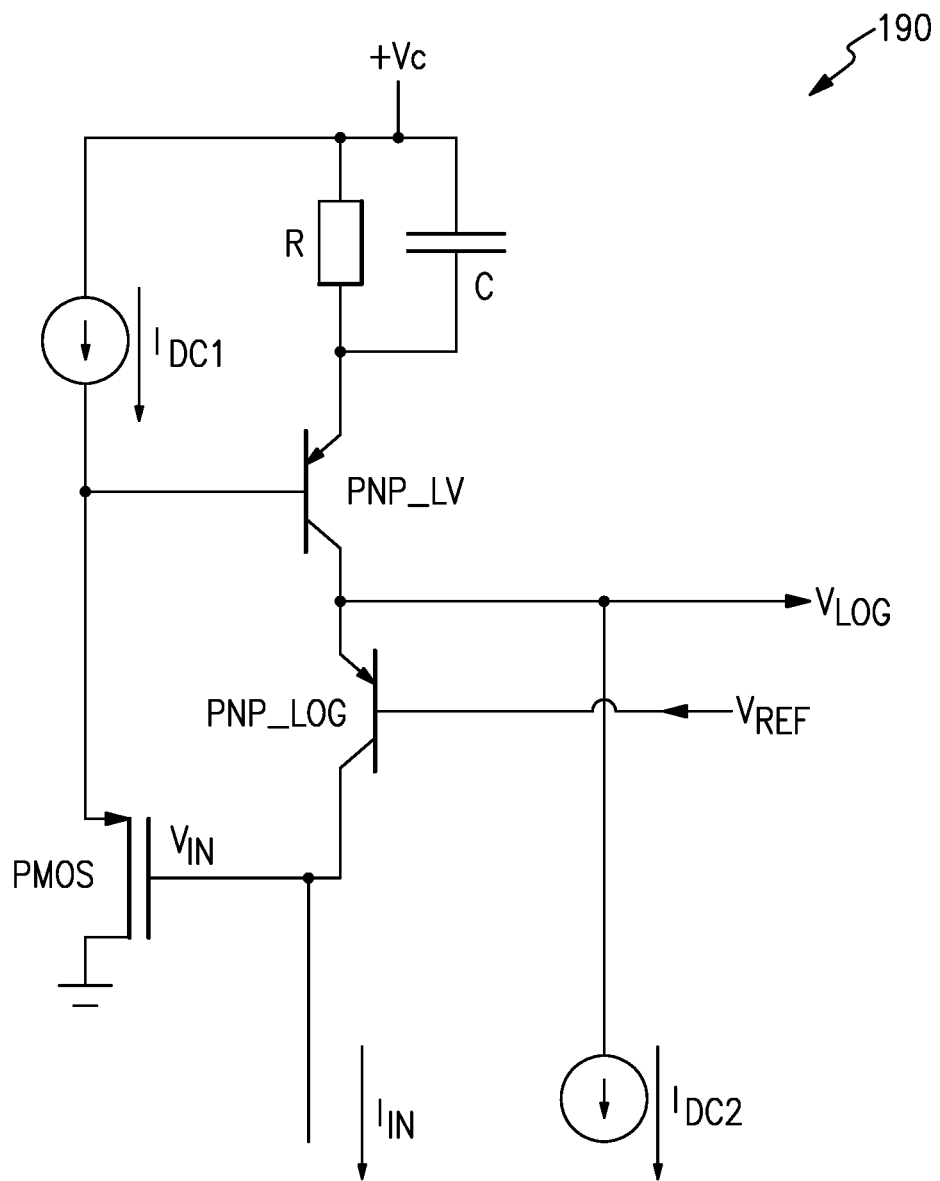
FIG. 3E is a schematic diagram of another embodiment of a logarithmic converter.

FIG. 3E is a schematic diagram of another embodiment of a logarithmic converter 190. The logarithmic converter 190 includes a FET transistor (p-type metal-oxide-semiconductor or PMOS, in this example), a first bipolar transistor PNP LOG (p-type, in this example), a second bipolar transistor PNP LV (p-type, in this example), a first DC current source $I_{DC1}$, a second DC current source $I_{DC2}$, a filter resistor R, and a filter capacitor C.

The logarithmic converter 190 of FIG. 3E is similar to the logarithmic converter 105 of FIGS. 1A and 1B, except that the logarithmic converter 190 illustrates a complementary configuration in which the transistor polarities are reversed or flipped.

Although FIGS. 3A to 3E depict various embodiments of logarithmic converters, the teachings herein are applicable to logarithmic converters implemented in a wide variety of ways. For example, the logarithmic converters herein can employ transistors of a wide variety of polarities and types.

Figure 4:
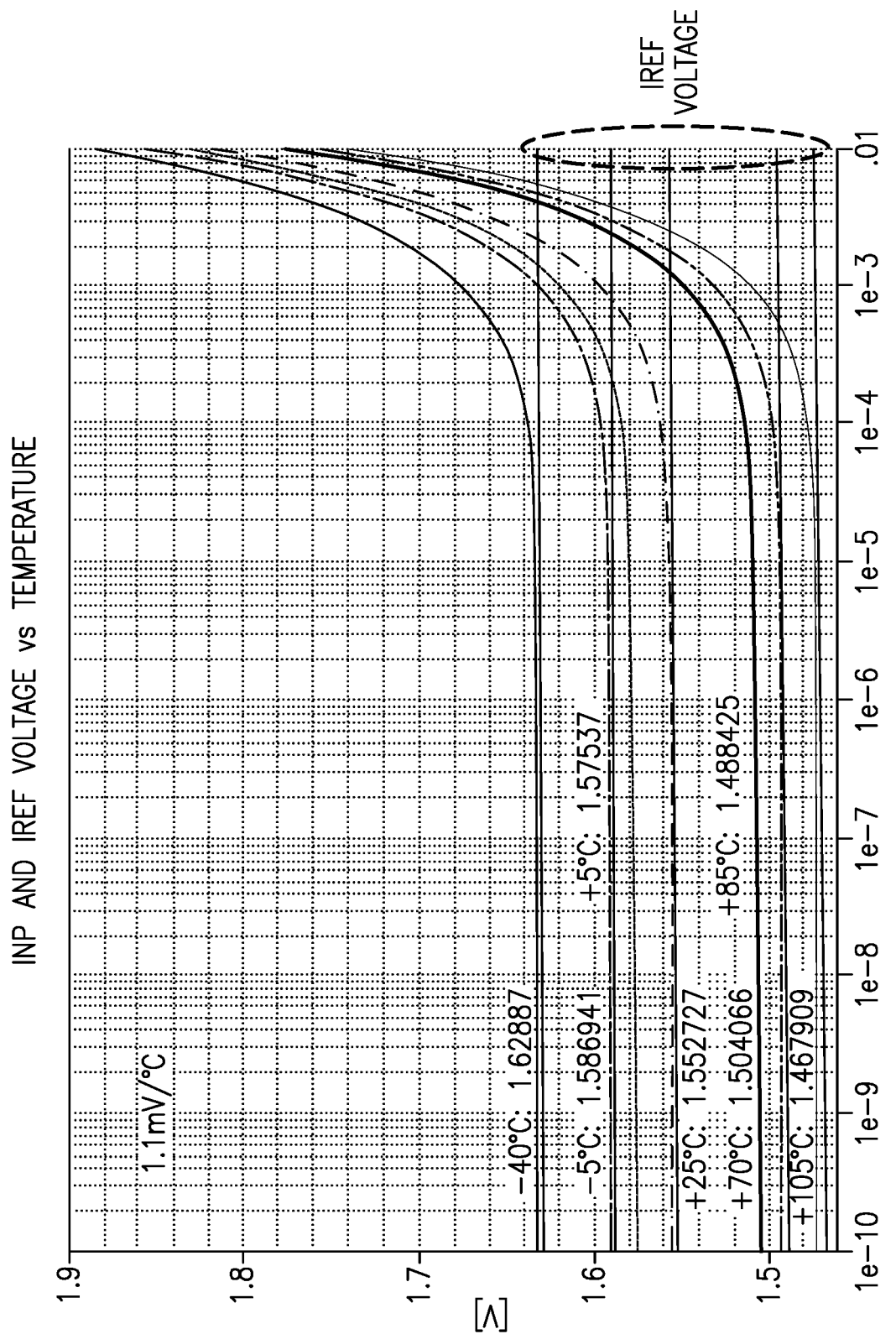
FIG. 4 is a graph of one example of input voltage versus input current and temperature.

FIG. 4 is a graph of one example of input voltage versus input current and temperature. The graph is depicted for one implementation of the logarithmic converter 105 of FIGS. 1A and 1B.

The collector-to-base voltage of the bipolar transistor NPN_LOG LOG NPN for high temperature/low input current operation should be set for desired log-linear performance. For example, optimum or near optimum performance can be achieved with the voltage in the range of 0 mV to 100 mV, which certain conventional logarithmic converters cannot accommodate. In contrast, the logarithmic converters herein exhibit excellent performance at low input current and at high temperatures.

Figure 5:
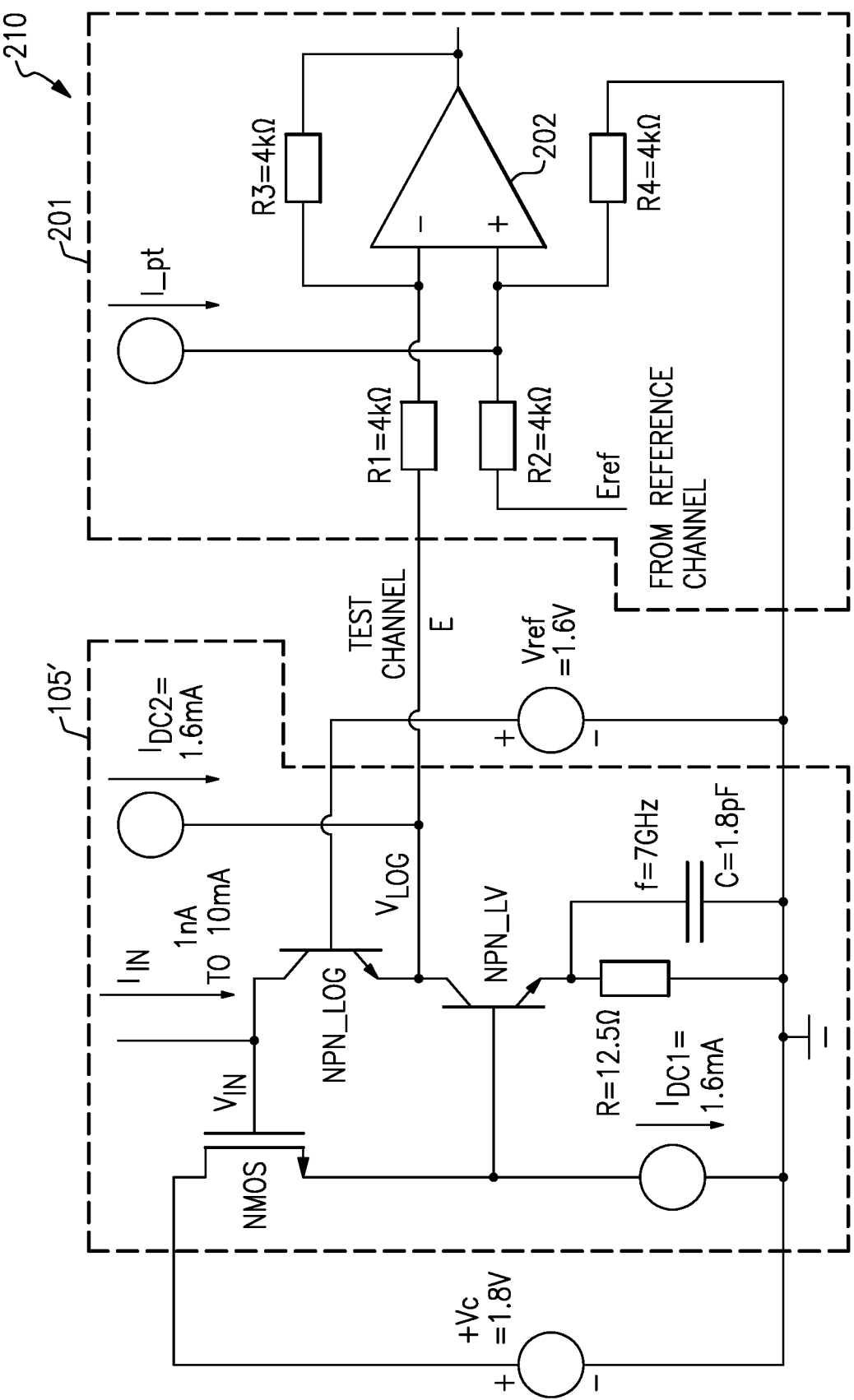
FIG. 5 is a schematic diagram of another embodiment of a logarithmic conversion system.

FIG. 5 is a schematic diagram of another embodiment of a logarithmic conversion system 210. The logarithmic conversion system 210 includes a logarithmic converter 105', which corresponds to one implementation of the logarithmic converter 105 of FIGS. 1A and 1B in which $I_{DC1}$=1.6 mA, $I_{DC2}$=1.6 mA, R=12.5 Ohm ($\Omega$), C=1.8 pF (thus providing a filter corner frequency f about equal to 7 GHz), and an input current $I_{IN}$ ranging from 1 nA to 10 mA coming from a photodiode. As shown in FIG. 5, the logarithmic conversion system 210 powers the logarithmic converter 105' with a power supply +Vc of about 1.8V and with a reference voltage source $V_{REF}$ of about 1.6V. The logarithmic converter 210 further includes an output circuit 201 for buffering the log voltage $V_{LOG}$ from the logarithmic converter 105'.

In the illustrated embodiment, the output circuit 201 includes a reference current source I_pt, a first resistor R1 (4$\Omega$, in this example), a second resistor R2 (4$\Omega$, in this example), a third resistor R3 (4$\Omega$, in this example), a fourth resistor R4 (4$\Omega$, in this example), and an output amplifier 202. The output circuit 201 receives a reference Eref from a reference channel.

As shown in FIG. 5, the feedback loop of the logarithmic converter 105' only involves 3 devices in signal path. In one example, a circuit (see for example, the embodiment of FIG. 2) sets the reference voltage $V_{REF}$ to keep the collector-to-base voltage of bipolar transistor NPN_LOG in the range between 0 mV and 100 mV for low levels of the input current $I_{IN}$. Additionally, as the input voltage VIN changes with the input current $I_{IN}$, the resistor R acts as extra input series resistance of 12.5$\Omega$, in this example. Furthermore, scaled copies of $I_{IN}$ can be obtained by connecting scaled copies of NPN_LOG devices to $V_{REF}$ and E to be used for variable photodetector bias (of the photodiode providing the input current $I_{IN}$).

Figure 6:
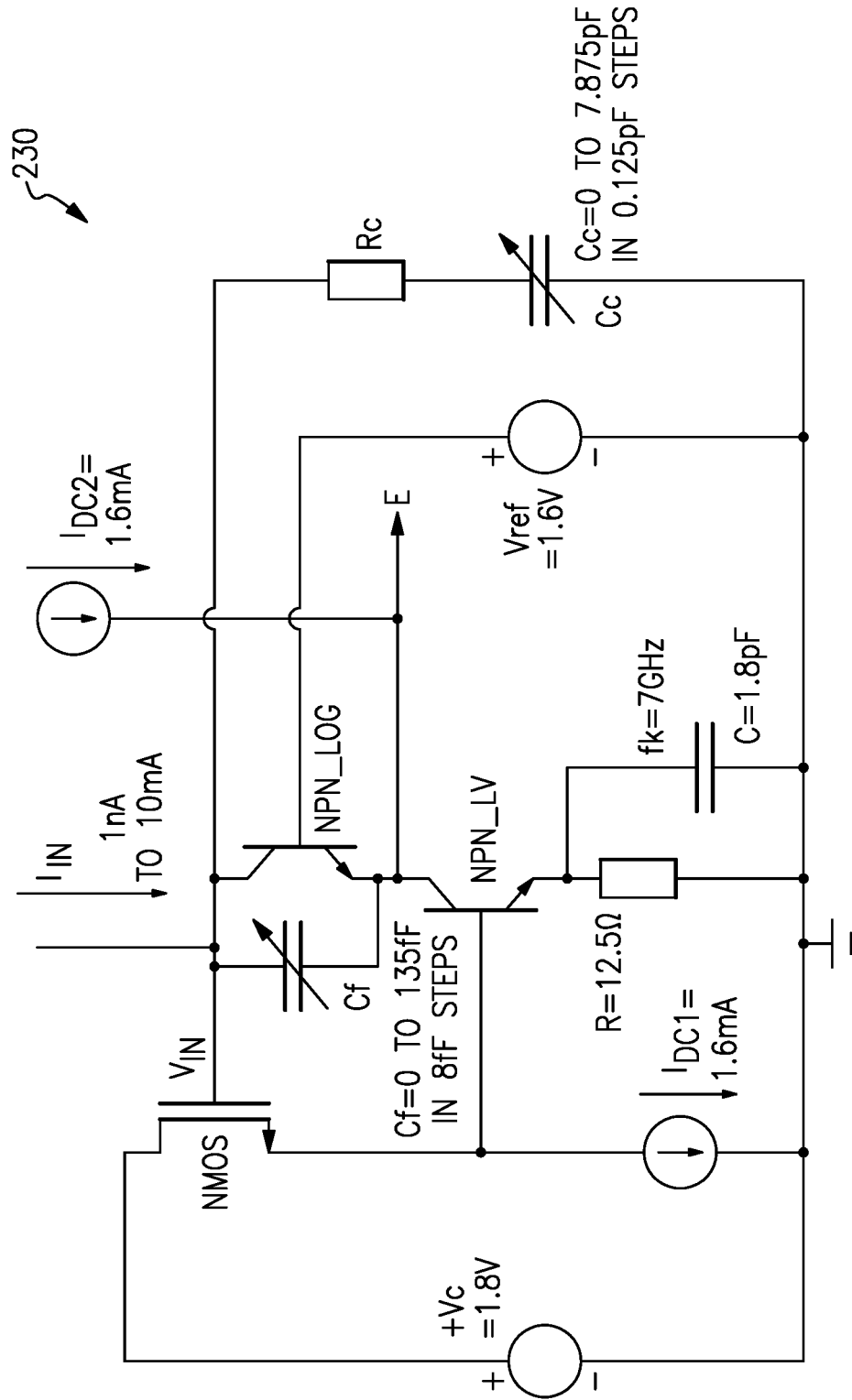
FIG. 6 is a schematic diagram of another embodiment of a logarithmic converter.

FIG. 6 is a schematic diagram of another embodiment of a logarithmic converter 230. The logarithmic converter 230 of FIG. 6 is similar to the logarithmic converter 105' of FIG. 6, except that the logarithmic converter 230 further includes a controllable capacitor Cf, a controllable capacitor Cc and a resistor Rc for loop stability.

In this embodiment, the current source $I_{DC2}$ has strong positive temperature dependence to reduce variation in loop stability versus temperature. Additionally, the current source $I_{DC2}$ sets the loop gain at low input current by setting the transconductance (Gm) of the bipolar transistor NPN_LV. Thus, the first (dominant) pole moves up and down with loop gain.

Furthermore, Cc is a variable capacitor bank that can lower the first (dominant) pole with a zero built in by using resistor Rc. This achieves good performance in AC loop stability. Additionally, Cf is a variable capacitor bank that can provide pole-splitting. Thus, good performance in transient input current $I_{IN}$ down-slope is achieved because of the emitter voltage moving upwards. Advantageously, the capacitor values can be very small yet have large effect on stability due to Miller effect (for example, with gain of 84 or more).

In another embodiment, at 10 GHz loop stability is enhanced with snubber circuits.

Figure 7:
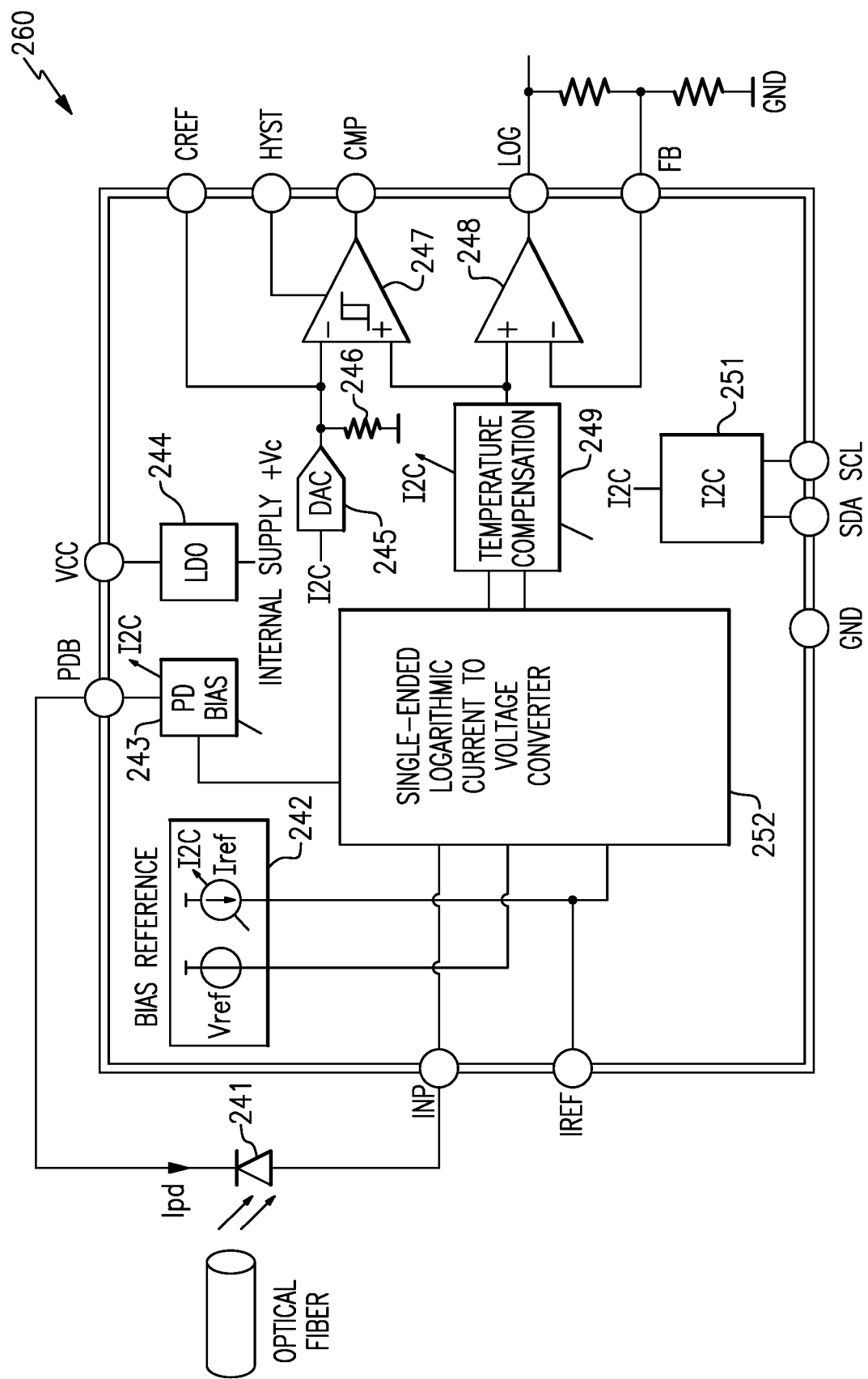
FIG. 7 is a schematic diagram of a photocurrent detection system according to one embodiment.

FIG. 7 is a schematic diagram of a photocurrent detection system according to one embodiment. The photocurrent detection system includes a semiconductor die 260 used for detecting the photocurrent Ipd of a photodiode 241. The semiconductor die 260 is also referred to as a semiconductor chip or integrated circuit (IC).

The semiconductor chip 260 uses a single-ended logarithmic current to voltage converter to process a photodiode current from the photodiode 241.

In the illustrated embodiment, the semiconductor chip 260 includes a bias reference circuit 242, a photodetector bias circuit 243, a low dropout (LDO) regulator 244, a digital-to-analog converter 245, a reference resistor 246, a hysteretic comparator 247, an output amplifier 248, a temperature compensation circuit 249, an interface 251 (I2C, in this example), and a single-ended logarithmic current to voltage converter 252. The single-ended logarithmic current to voltage converter 252 can be implemented in accordance with any of the embodiments herein.

The semiconductor die 260 serves as a monolithic logarithmic trans-impedance amplifier for high performance measurement of low frequency and wide dynamic range signal power in fiber optic systems (detecting light from optical fiber). The semiconductor die 260 generates a highly accurate, temperature compensated output voltage LOG that is proportional to the logarithm of the ratio between the input current at pin INP, and a reference current. The reference current can either be generated internally (setting the logarithmic intercept) by the bias reference circuit 242, or externally provided through the pin $I_{REF}$ (for example, using log-ratio detection). The logarithmic slope and intercept are both accurately trimmed to a nominal value (for example, 200 mV/decade and 100 pA, respectively), and both can be adjusted through the I2C interface.

The low-impedance logarithmic output LOG has enough drive capability to drive an analog-to-digital converter (ADC) and/or other circuit.

A built-in fast hysteretic comparator 247 provides a compact solution to compare the logarithmic output to a reference level, either programmed through I2C or supplied through the CREF interface. The comparator 247 has adjustable hysteresis and an optional output latch function, each of which are controllable through the interface HYST. The comparator's output is provided at pin CMP.

Adaptive photo diode biasing is supported through the bias interface PDB. At low diode current, the reverse bias diode bias is kept small to reduce dark current. At higher input currents the bias voltage scales linearly with the current to avoid nonlinearity due to photo diode saturation. The starting bias level as well as the scale factor at higher currents are configurable through I2C, which is associated with data pin SDA and clock pin SCL. The I2C allows for configuration of the logarithmic slope and intercept, as well as the adaptive photo diode bias circuit.

Any of the logarithmic converters and logarithmic converter detection systems herein can be included on a semiconductor die and used to detect an input current provided by a photodetector.

The semiconductor die 260 also includes pins for supply voltage VCC (regulated by LDO regulator 244), ground (GND), and an output feedback (FB) function.

Figure 8:
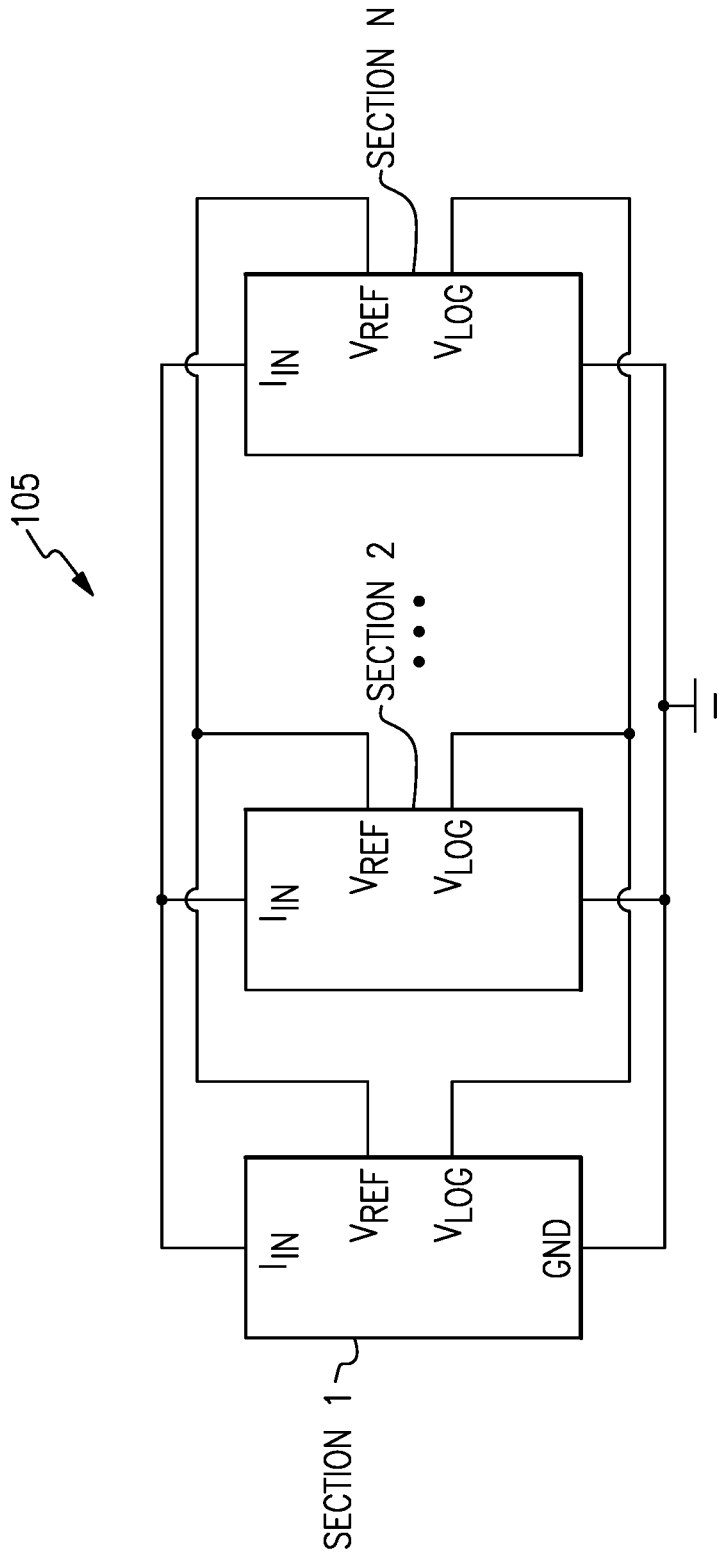
FIG. 8 is a schematic diagram of another embodiment of a logarithmic converter.

FIG. 8 is a schematic diagram of another embodiment of a logarithmic converter 105.

In the illustrated embodiment, the logarithmic converter 105 of FIGS. 1A and 1B has been partitioned into parallel lower current sections (an integer n sections, where n is 2 or more) in parallel to achieve a superior ESD rating. For example, by dividing the circuit up into multiple lower current sections in parallel, each section sees a proportional lower ESD impact and local heating is reduced. Moreover, such a configuration provides shorter connections and improved high frequency stability.

Any of the logarithmic converters herein can be partitioned into sections for enhanced ESD performance and/or better high frequency stability.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A logarithmic current to voltage converter comprising:
an input terminal configured to receive an input current;
an output terminal configured to provide a logarithmic output voltage;
a first field-effect transistor (FET) having a gate connected to the input terminal;
a first bipolar transistor having a collector connected to the input terminal and an emitter connected to the output terminal; and
a stacked transistor connected to the output terminal and to the first FET.

2. The logarithmic current to voltage converter of claim 1, wherein the stacked transistor is a second bipolar transistor, wherein a base of the second bipolar transistor is connected to a source of the first FET and a collector of the second bipolar transistor is connected to the output terminal.

3. The logarithmic current to voltage converter of claim 2, further comprising a first current source coupled to the base of the second bipolar transistor and a second current source coupled to the output terminal.

4. The logarithmic current to voltage converter of claim 2, further comprising a parallel combination of a first resistor and a capacitor connected between an emitter of the second bipolar transistor and a ground voltage.

5. The logarithmic current to voltage converter of claim 4, further comprising a second resistor and a controllable capacitor connected in series between the collector of the first bipolar transistor and the ground voltage.

6. The logarithmic current to voltage converter of claim 2, further comprising one or more follower stages connected between the source of the first FET and the base of the second bipolar transistor.

7. The logarithmic current to voltage converter of claim 1, wherein the first field-effect transistor is a metal-oxide-semiconductor (MOS) transistor.

8. The logarithmic current to voltage converter of claim 1, wherein the first field-effect transistor is a junction field-effect transistor (JFET).

9. The logarithmic current to voltage converter of claim 1, wherein the first field-effect transistor, the first bipolar transistor, and the stacked transistor are n-type.

10. The logarithmic current to voltage converter of claim 1, wherein the stacked transistor is a second FET, wherein a gate of the second FET is connected to a source of the first FET and a drain of the second FET is connected to the output terminal.

11. The logarithmic current to voltage converter of claim 1, further comprising a controllable capacitor connected across the collector of the first bipolar transistor and the emitter of the first bipolar transistor.

12. A photocurrent detection system comprising:
a photodetector configured to generate an input current; and
a semiconductor die comprising a first logarithmic converter, wherein the first logarithmic converter comprises:
an input terminal configured to receive the input current;
an output terminal configured to provide a first logarithmic output voltage;
a first field-effect transistor (FET) having a gate connected to the input terminal;

a first bipolar transistor having a collector connected to the input terminal and an emitter connected to the output terminal; and a stacked transistor connected to the output terminal and to the first FET.

13. The photocurrent detection system of claim 12, wherein the stacked transistor is a second bipolar transistor, wherein a base of the second bipolar transistor is connected to a source of the first FET and a collector of the second bipolar transistor is connected to the output terminal.

14. The photocurrent detection system of claim 13, further comprising a parallel combination of a resistor and a capacitor connected between an emitter of the second bipolar transistor and a ground voltage.

15. The photocurrent detection system of claim 13, wherein the first field-effect transistor, the first bipolar transistor, and the second bipolar transistor are n-type.

16. The photocurrent detection system of claim 12, further comprising a reference current source configured to generate a reference current and a second logarithmic converter including an input terminal configured to receive the reference current and an output terminal configured to provide a second logarithmic output voltage, wherein the photocurrent detection signal is configured to output a differential logarithmic output voltage corresponding to a difference between the first logarithmic output voltage and the second logarithmic output voltage.

17. The photocurrent detection system of claim 16, further comprising a DC current source configured to generate a DC current and a third logarithmic converter including an input terminal configured to receive the DC current, and a buffer configured to buffer an input voltage of the input terminal of the third logarithmic converter to generate a reference voltage operable to bias a base of the first bipolar transistor.

18. The photocurrent detection system of claim 17, further an offset trimming circuit configured to provide a voltage adjustment to the reference voltage.

19. The photocurrent detection system of claim 12, wherein the first logarithmic converter is partitioned into two or more sections connected in parallel.

20. A method of logarithmic current to voltage conversion, the method comprising:
providing an input current from an input terminal to a collector of a first bipolar transistor;
providing a logarithmic output voltage from an emitter of the first bipolar transistor to an output terminal; and
providing feedback from the output terminal to the input terminal through a stacked transistor and a first field-effect transistor (FET), a gate of the first field-effect transistor (FET) connected to the input terminal and the stacked transistor connected to the output terminal and a source of the first FET.

* * * * *